United States Patent [19]

Bäumler et al.

[11] 4,102,666
[45] Jul. 25, 1978

[54] METHOD OF SURFACE CRYSTALLIZING QUARTZ

[75] Inventors: Peter Bäumler, Dörnigheim; Gerhard Höfer, Bruchköbel; Tassilo Körner, Erlensee; Heinrich Mohn, Hailer; Karl Seiler, Hanau-Hohe Tanne; Fritz Simmat, Meerholz; Karlheinz Rau, Hanau, all of Fed. Rep. of Germany

[73] Assignee: Heraeus-Schott Quarzschmelze GmbH, Hanau, Fed. Rep. of Germany

[21] Appl. No.: 616,522

[22] Filed: Sep. 25, 1975

Related U.S. Application Data

[60] Division of Ser. No. 383,432, Jul. 27, 1973, Pat. No. 3,927,697, which is a division of Ser. No. 166,844, Jul. 28, 1971, Pat. No. 3,776,809, which is a continuation of Ser. No. 793,755, Jan. 24, 1969, abandoned, and Ser. No. 810,713, Mar. 26, 1969, abandoned.

[30] Foreign Application Priority Data

Feb. 22, 1968 [DE] Fed. Rep. of Germany ....... 1696061
Mar. 30, 1968 [DE] Fed. Rep. of Germany ....... 1771077
Mar. 30, 1968 [DE] Fed. Rep. of Germany ....... 1988697

[51] Int. Cl.² ................................. C03C 21/00
[52] U.S. Cl. ........................ 65/33; 65/30 R; 65/111
[58] Field of Search ................. 65/33, 30 R, 111

[56] References Cited

U.S. PATENT DOCUMENTS

| | | | |
|---|---|---|---|
| 3,116,137 | 12/1963 | Vasilus et al. | 65/33 |
| 3,454,386 | 7/1969 | Ernsberger | 65/33 |
| 3,464,807 | 9/1969 | Pressau | 65/33 |
| 3,464,880 | 9/1969 | Rinehart | 65/33 X |
| 3,490,888 | 1/1970 | Strong | 65/33 |
| 3,490,984 | 1/1970 | Petticrew et al. | 65/33 |
| 3,499,773 | 3/1970 | Petticrew et al. | 65/33 X |
| 3,504,819 | 4/1970 | Veres | 65/33 |
| 3,516,810 | 6/1970 | Ivey et al. | 65/33 |
| 3,524,748 | 8/1970 | Beal | 65/33 X |
| 3,565,595 | 2/1971 | Gaskell et al. | 65/33 X |
| 3,957,476 | 5/1976 | Rau | 65/33 X |

OTHER PUBLICATIONS

"Handbook of Glass Manufacture," vol. II, Fay V. Tooley – Ogden Pub. Co., New York, 1960, pp. 192–199.

Primary Examiner—Robert L. Lindsay, Jr.
Assistant Examiner—F. W. Miga
Attorney, Agent, or Firm—Burgess, Dinklage & Sprung

[57] ABSTRACT

Quartz glass element, such as a diffusion tube useful in the production of semiconductor elements, capable of forming an outer layer of uniformly fine crystalline silica such as cristobalite or tridymite when heated to a temperature at which such crystalline silica forms containing crystallization promoting nuclei having a rate of diffusion in quartz glass less than that of sodium at elevated temperatures. Such nuclei are preferably present in the outer half of the element wall. When the quartz glass element is exposed to elevated temperatures, the nuclei promotes the formation of the outer layer of uniformly fine crystalline silica which imparts thermal dimensional stability for extended periods of use at elevated temperatures.

10 Claims, 6 Drawing Figures

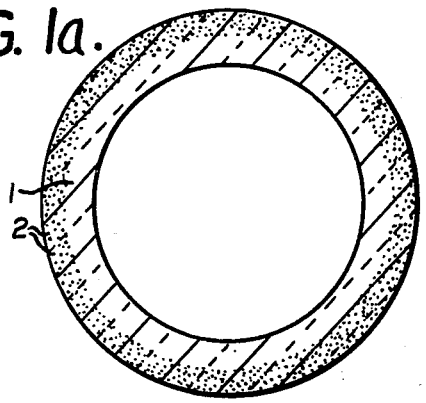
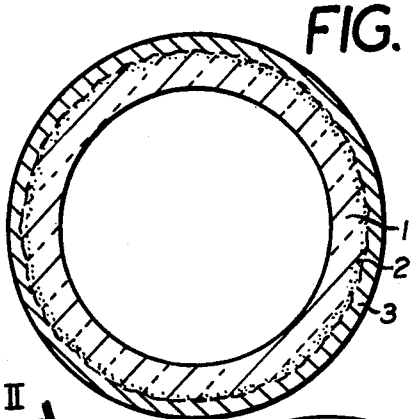
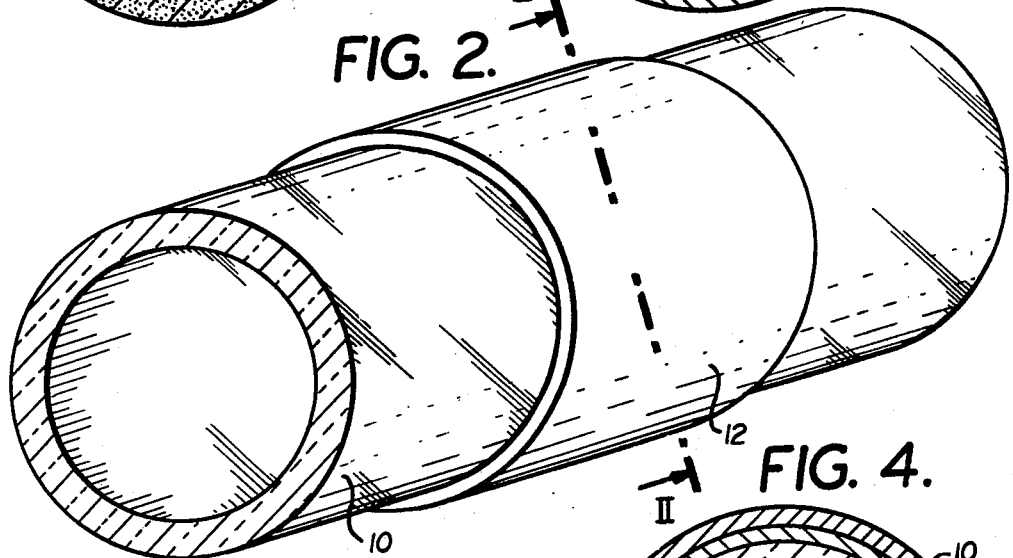
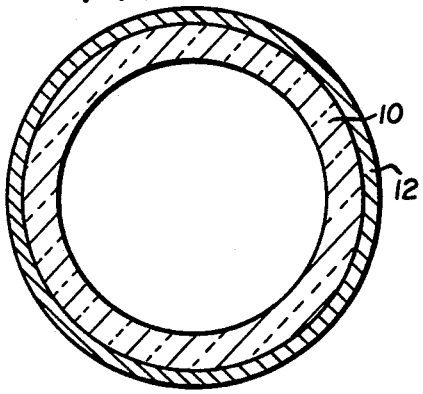
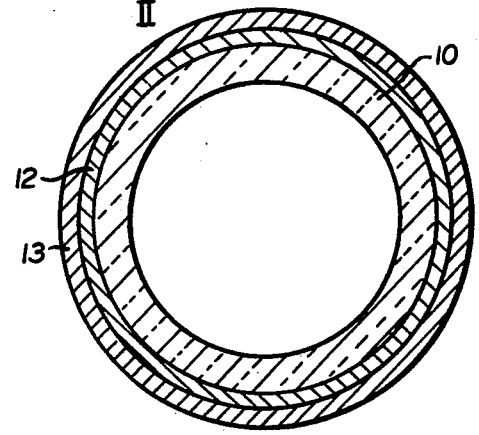

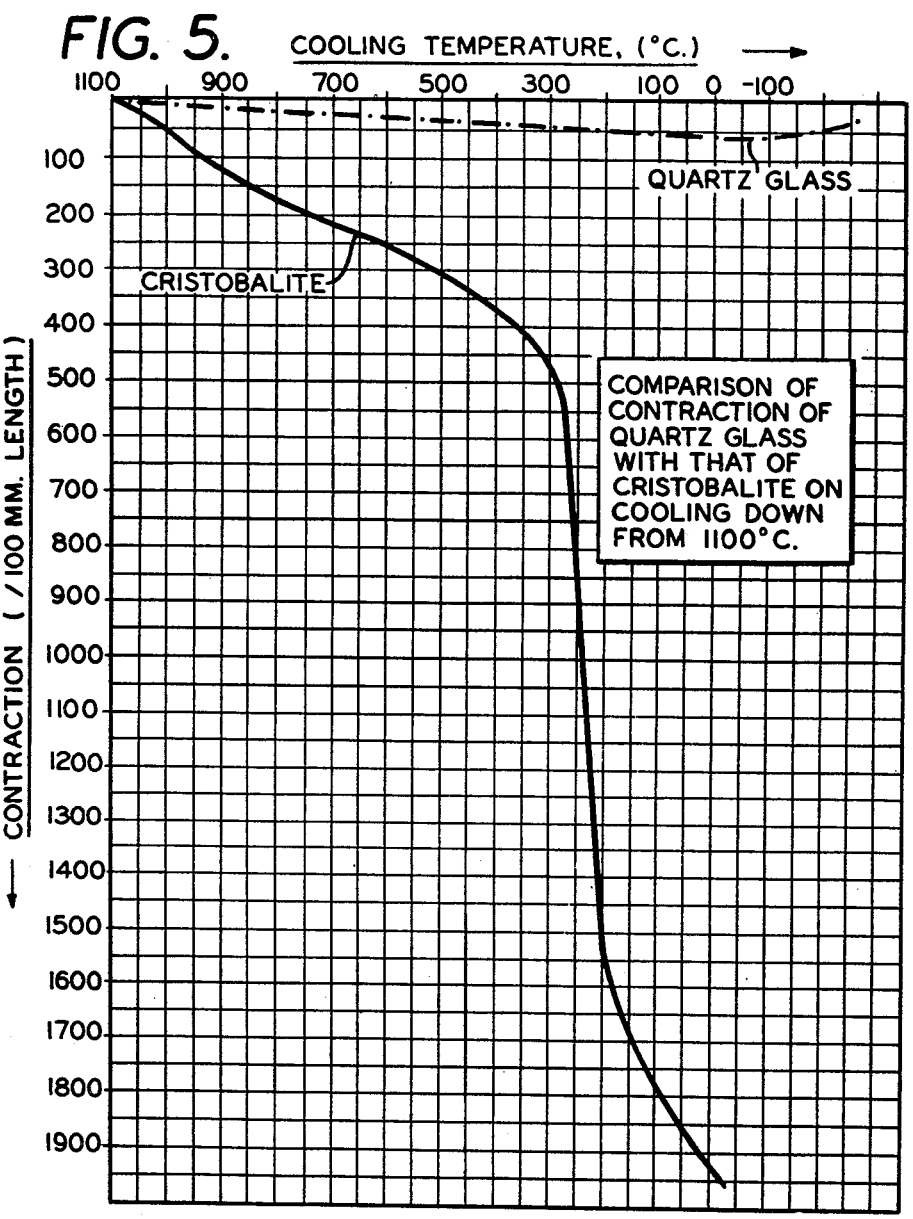

METHOD OF SURFACE CRYSTALLIZING QUARTZ

RELATED APPLICATIONS

This is a division of application Ser. No. 383,432 filed July 27, 1973, now U.S. Pat. No. 3,927,697 issued Dec. 23, 1975, which is, in turn, a division of Ser. No. 166,844 filed July 28, 1971, Now U.S. Pat. No. 3,776,809 issued Dec. 4, 1973, which is, in turn, a continuation of Ser. No. 793,755 filed Jan. 24, 1969, and Ser. No. 810,713 filed Mar. 26, 1969, both now abandoned.

BACKGROUND

This invention relates to quartz glass elements having improved thermal dimensional stability making them suitable for use at elevated temperatures for extended periods of time. More particularly, this invention relates to improved quartz glass elements having a hollow or tubular shape especially useful for producing semiconductor elements at temperatures higher than previously attainable with prior quartz glass elements.

In the art of producing semiconductor elements such as diodes, four-layer diodes, transistors, integrated circuits and the like, diffusion processes are employed, for example, for doping the semiconductors. For this purpose, the semiconducting crystal is subjected at high temperatures to the action of different gaseous atmospheres, for example, a phosphorus atmosphere and/or a gallium atmosphere. The semiconducting crystal or crystals which in many cases have the shape of small plates are then secured on a carrier of quartz glass. For carrying out the diffusion process, this carrier upon which the semiconducting crystals are applied is inserted into a diffusion tube of quartz glass in an electrically heated annealing furnace. The gaseous atmosphere which is predetermined for doping the semiconducting crystals is then maintained in the diffusion tube at a predetermined diffusion temperature. This is usually done by conducting the doping substance through the quartz-glass tube in the form of a gaseous current.

In order to carry out their functions properly, the semiconducting elements must possess certain properties, especially insofar as the cross-sectional diffusing shape, the resistance values and the durability of the carriers are concerned. These properties are, however, determined to a very considerable extent by the amount of impurities and also by the presence of so-called semiconductor poisons which might enter and contaminate the semiconducting elements during the course of their production. Therefore, not only the raw material but also all other materials which might possibly affect the purity of these elements in the course of their production either directly or indirectly have to comply with extremely high requirements of purity. When quartz glass is employed as a material in the production of semiconducting elements, these requirements previously necessitated the carriers for the semiconducting crystals and the diffusion tubes to be made of a quartz glass of such a high degree of purity that it preferably contained a total of less than 4 ppm (parts per million) of metallic impurities.

In order for the diffusion treatment to be carried out within the shortest possible length of time, it should be effected at the highest possible temperature since the rate of speed of diffusion increaases very rapidly as the temperature is increased. However, the upper temperature limit at which diffusion treatments could previously be carried out in actual practice amounted only to approximately 1,200° to 1,280° C. and often they had to be carried out at a temperature of less than 1,200° C. since by remaining continuously in the annealing furnace the diffusion tubes of quartz glass were often plastically deformed to the extent that the carriers with the semiconducting crystals thereon would no longer fit into the tubes.

The French Pat. No. 1,293,554 discloses a diffusion tube which consists of quartz and is provided on its outer side with a coating which will become liquid at the temperature at which the semiconducting crystals are treated. This coating is intended to prevent impurities from penetrating by diffusion through the quartz diffusion tube into the area within the quartz tube which forms the treating chamber for the semiconducting crystals. However, such diffusion tubes of quartz glass which remain continuously in the annealing furnace also have the disadvantage that they will be plastically deformed very considerably when the diffusion temperature is made too high.

The deterioration of diffusion tubes by cracking is caused by irregular devitrification or recrystallization of the quartz glass brought on by exposing such tubes to elevated temperatures such as those encountered in preparing semiconductor elements. Prior attempts to overcome this problem of thermal instability were directed at preventing or retarding devitrification or recrystallization. For example, in U.S. Pat. No. 2,904,713, quartz glass is produced wherein substantially no crystallization seeds are present thus imparting to the quartz glass a high resistance against recrystallization. In U.S. Pat. Nos. 3,370,921 and 3,472,667, elemental silicon or boron are utilized to create an oxygen deficiency in quartz bodies thus minimizing crystalline growth. And in U.S. Pat. No. 2,568,459, a glaze applied to the quartz surface retards and largely prevents quartz devitrification by preventing the diffusion of hydrogen through the hot quartz.

In the field of glass ceramics, increased resistance to breaking, cracking or failing due to mechanical impacts has been achieved according to U.S. Pat. No. 2,998,675 and 3,275,493 by combining silica, alumina and lithium oxide or magnesium oxide, in certain critical proportions, with a metal oxide crystallization catalyst. Such glass ceramic compositions are subjected to a heat treatment which results in a glass ceramic article having on its surface a thin, semicrystalline layer, which because it has a linear thermal expansion coefficient substantially lower than the interior glass, establishes a compressive stress in and parallel to the surface after the article is cooled. In other words, the interior glass shrinks more on cooling which tends to compress the surface layer in effect making it harder thus resulting in an increase in the modulus or rupture strength of the glass ceramic article. However, this phenomenon has no effect on the notoriously poor stability of glass ceramics because both the semicrystalline layer and the interior glass will rapidly devitrify and deteriorate by cracking at temperatures of 1000° C. and higher as is characteristic of glass ceramics.

SUMMARY

The present invention provides an improved quartz glass element, such as a diffusion tube useful in the production of semiconductor elements, capable of forming an outer layer of uniformly fine crystalline silica such as cristobalite or tridymite when heated to a temperature at which such crystalline silica forms which contain crystallization promoting nuclei having a rate of diffusion in quartz glass less than that of sodium at elevated temperatures. Such nuclei are preferably present in the outer half of the element wall. When the quartz glass element is exposed to elevated temperatures, the nuclei promotes the formation of the outer layer of uniformly fine crystalline silica which imparts to the element thermal dimensional stability for extended periods of use at elevated temperatures.

In an alternate embodiment, a quartz glass element, with or without crystallization promoting nuclei as described above, is provided with a thin outer layer of uniformly fine crystalline silica such as cristobalite or tridymite.

The quartz glass elements of the present invention are utilized in tubular form in an improved diffusion process for preparing semiconductor elements at temperatures of 1200° C. and higher and preferably at temperatures of 1300° C. and higher.

THE DRAWINGS

FIG. 1a shows a preferred embodiment of a quartz glass tube 1 containing substantially uniformly distributed crystallization promoting nuclei 2 in the outer portion thereof on a greatly enlarged scale for illustrative purposes only.

FIG. 1b is the same as FIG. 1a but illustrates the formation of a uniformly fine crystalline silica layer 3 on a greatly exaggerated scale.

FIG. 2 shows an alternate embodiment of a quartz glass tube 10 provided with a partial coating of crystalline silica 12.

FIG. 3 is a cross-sectional view taken along line II—II of FIG. 2.

FIG. 4 is a cross-sectional view of the coated tube of FIGS. 2 and 3 provided with a protective coating 13.

FIG. 5 is a graph comparing the contraction of quartz glass with that of cristobalite on cooling down from 1100° C.

DESCRIPTION

It is an object of the present invention to provide a quartz-glass element, for example, of a tubular shape, which is designed so that, when employed in the production of semiconducting elements which is carried out at a high temperature, that is, of elements which is carried out at a high temperature, that is, of elements such as diodes, four-layer diodes, transistors, integrated circuits or the like, no impurities or semiconductor poisons can pass from this element either directly or indirectly into the semiconducting crystals, and which also permits diffusion treatments to be carried out without detrimental effects at still higher temperatures than could previously be employed.

It has now been unexpectedly discovered that this object may be attained if the outer surface layer of the quartz-glass element such as a tube 1 shown in FIG. 1a contains not only silica but also at least one additional crystallization promoting substance 2 which has a degree of concentration of more than 4 ppm and up to several hundred ppm, preferably 10 to 800 ppm, and does not form a poison which will affect the semiconducting element which is to be treated at a temperature above 1,200° C. and preferably above 1,280° C., and which at temperatures between approximately 1,200° and 1,380° C. has a low rate of speed of diffusion into silica as compared with the rate of sodium.

Prior to this invention it was conventional in the methods of producing semiconductors at high temperatures to employ quartz glass of the highest degree of purity as the material for making the diffusion tube or, for example, the carrier of the semiconducting crystals. The quartz glass elements according to the invention in contrast contain additional substances of particular types and of particular quantities. As an entirely unexpected and very important advantage of these quartz glass elements it has been found that they will show practically no deformation even though they are maintained for a considerable length of time at temperatures of approximately 1,300° C. Thus, it has especially been found that, while diffusion tubes which are made in the conventional manner of quartz glass of a high degree of purity are often considerably deformed, those which are made according to the invention so that their outer surface layer consists of silica and an additional substance were not deformed. The quartz-glass elements according to the invention therefore permit, for example, the diffusion treatment of semiconducting crystals to be carried out at considerably higher temperatures than could previously be employed and without danger that this might cause any detrimental secondary effects. The use of such high temperatures permits the length of time of the diffusion treatment to be reduced considerably since the rate of speed of diffusion increases exponentially with the temperature.

If the entire volume of the quartz-glass elements according to the invention contains crystallization promoting nuclei aside from silica at the rate of concentration as stated, they may be produced, for example, in a very simple manner from a homogenized melted mass consisting of silica and the desired nuclei. This technique is illustrated in Example 1 herein.

For producing quartz-glass elements and especially the preferred tubular elements according to the invention in which only the outer surface layer of each element contains crystallization promoting nuclei aside from silica, it is possible to employ several different methods. Thus, for example, the surface of a tubular element of quartz-glass of a high degree of purity may be covered with the additional substance containing such nuclei, for example, by spraying or vaporizing it thereon, preferably, under a vacuum, and by then subjecting the coated tube to a heating process. An enamel coating and heating process for making such a tubular element is illustrated in Example 2 herein.

When the elements of the invention are employed, as for example when they are used as diffusion tubes in the semiconductor art, a recrystallization commences at temperatures above 1000° C. with the formation of cristobalite and/or tridymite. This recrystallization starts quickly, uniformly and homogeneously, but on account of the distribution of the nuclei of the invention it progresses slowly and steadily. Crystal anisotropy, which may have the effect of diminishing strength, has not been observed in the quartz glass parts of the invention. The improved stability of shape at high temperatures which is displayed by quartz glass apparatus parts made by the invention is probably to be attributed to the constance of the growth of the crystalline silica layer owing to the distribution of nuclei according to the invention, and to the shrinkage and tension effects associated therewith. Lastly, an additional advantage is that due to the compression of the quartz glass structure which this produces during the heating thereof, as for example during the doping of semiconductor elements, the penetration of foreign ions which interfere with the doping process is virtually excluded.

According to another embodiment of the invention, the outside of at least that part of a tube of quartz glass which is to be exposed to a temperature of more than 1000° C. is provided with a coating consisting of a cohesive finely crystalline silica layer which is composed of crystalline modifications of quartz, preferably a cristobalite layer, and has a thickness of less than 5% and preferably less than 1% of the thickness of the wall of the quartz-glass element or tube to which this coating is applied.

It was a surprising fact that the quartz-glass elements or tubes according to the invention which were provided with a very thin cohesive, finely crystalline outer layer or coating, especially of cristobalite, were found not to break when a temperature threshhold of approximately 300° C. was surpassed either from below or from above, despite the fact which as such is well-known in the art that, because of a change in structure, the coefficient of thermal expansion, for example, of cristobalite possesses a point of unsteadiness within this temperature range. This is probable due to the fact that the coating layer of finely crystalline cristobalite is extremely thin.

The quartz-glass tubes according to the invention which are provided with such a cohesive, uniformly fine crystalline silica layer or coating, especially of cristobalite, have also not shown any considerable deformation when remaining for a longer period, for example, of several weeks, under temperatures, which amounted up to approximately 1300° C. The excellent mechanical solidity of these quartz-glass tubes also at temperatures of more than 1000° C. is probably due to the fact that the finely crystalline coating or layer of these tubes specially of cristobalite, is cohesive and that the crystals still grow at high temperatures.

Another feature of the invention which has proved to be of great advantage involves applying a protective coating over the finely crystalline layer or coating. Such a protective coating prevents impurities from penetrating into the quartz-glass tube, for example, from the muffle of the annealing furnace, during the period in which the quartz-glass tube is heated up to the temperature at which the doping of the semiconductors is carried out. Such impurities might result in the occurrence of undesirable crystallizing processes in the quartz-glass tube. It has also been found that for producing such a protective layer it is of advantage to employ materials which at temperatures of approximately 1300° C. do not evaporate very strongly but already become plastic or soft. Such materials may consist, for example, of germanium oxide and silicon oxides or glass mixtures which are plastic at a temperature of approximately 1300° C.

As illustrated in FIG. 2, the quartz-glass tube 10 is provided according to the invention along a certain length thereof with a choesive, finely crystalline coating of crystalline silica 12 that is, preferably with a coating of cristobalite. Of course, it is also possible to provide the entire length of the quartz-glass tube 1 with such a finely crystalline coating. It is, however, of advantage to apply this coating only upon those parts of the quartz-glass tube which are exposed to high temperatures of more than 1000° C., such as the high temperature semiconductor doping zone. By coating only these parts of the quartz-glass tube, the latter retains, for example, the possibility of connecting ground or unground quartz-glass elements to the uncoated parts of the tube and especially to the ends thereof.

FIG. 4 illustrates a cross section of a quartz-glass tube 10 which according to the invention is not only provided with a coating 12 of finely crystalline silica especially of cristobalite, but also with a protective coating 13 which is applied upon the outer surface of the coating 12.

The production of quartz-glass tubes which are provided with a coating of cristobalite may be carried out, for example, by spraying cristobalite powder of high purity upon the quartz-glass tube and by burning this coating into the outer surface of the quartz glass by means of a flame or in a furnace and, if desired, by maintaining the quartz-glass tube at a high temperature for such a length of time until the burned-in nuclei have grown together into a cohesive, finely crystalline layer as distinguished from a distinct overlying-coating. If the area of the quartz-glass tube upon which the cristobalite coating is applied has, for example, a wall thickness of approximately 2 mm, the thickness of the layer of cristobalite amounts, for example, to less than 0.02 mm.

The phrase "crystallization promoting nuclei" is intended to include those substances that will promote the formation of crystalline silica such as cristobalite and tridymite for example when a quartz-glass element of the invention is heated to a temperature at which such crystalline silica forms.

For purposes of this invention and particularly in the case of diffusion tubes, the temperature at which crystalline silica forms falls within the range of 900° to 1550° C preferably in the range of 900° to 1350° C. Crystalline silica is known to have several forms among which are alpha and beta quartz, alpha and beta cristobalite and alpha and beta tridymite. In the temperature ranges referred to above, the formation of certain crystalline forms is favored and two or more crystalline forms may be present at the same time. For example, in the temperature ranges indicated it is believed that beta cristobalite forms faster than other forms of crystalline silica and for this reason is probably the predominate type of crystalline silica formed according to those invention. However, this invention is in no way limited or restricted to the formation of any particular form or forms of crystalline silica. It is sufficient to form a layer of crystalline silica (whatever its form or forms) as shown in FIG. 1b by reference number 3 to obtain the highly desirable properties and advantages of this invention.

It should also be understood that crystalline silica, regardless of type or types, is converted to amorphous or vitreous silica when heated to its fusion temperature which is about 1730° C, preferably above about 1750° C, for a period of time sufficient to complete the conversion. Vitreous silica once formed by fusion remains in this form when cooled down to ambient temperatures. It is only when an article formed from vitreous silica is reheated does devitrification or recrystallization occur. The amorphous form of silica is also known as quartz glass, fused silica, vitreous silica, vitreous quartz and fused quartz. Regardless of the nomenclature, the important difference is that quartz glass elements of the invention are amorphous at the outset and the nuclei present therein forms a layer of crystalline silica when the element is exposed to temperatures in the range of 900° to 1550° C.

Thus, the formation of quartz-glass elements containing nuclei can be carried out without forming crystalline silica due to the fact that at temperatures above the fusion temperature of silica, about 1730° C., only amorphous silica is formed. Thus, it is possible to supply semiconductor manufacturers with nuclei containing quartz-glass tubes after which the beneficial crystalline silica layer is formed during the diffusion process.

The crystallization promoting nuclei are atomic in dimension and include one or more atoms, ions and/or individual molecules and are the centers around which the crystalline silica forms and grows according to the invention. Suitable nuclei have a rate of diffusion in quartz-glass less than that of sodium at elevated temperatures, for example 1000° C. or higher, and include an element from Group IV of the periodic table, boron, aluminum, phosphorus, antimony, zinc, mangesium, calcium, gallium and mixtures thereof. Compounds from which nuclei are obtained include the oxides, carbides or nitrides of any of the foregoing, as for example aluminum nitride, aluminum oxide, germanium oxide, tin oxide, silicon carbide, silicon nitride, silica suboxides, and the like. Zinc, magnesium, calcium, tin, boron, phosphorus, aluminum, titanium, zirconium hafnium, antimony and gallium ions because of their large ion radius have been found to be especially useful for forming fine crystalline silica layers. Most preferred is aluminum.

According to the present invention, crystallization promoting nuclei are incorporated into the molecular structure of the quartz glass. Methods for accomplishing this are illustrated in the examples. For instance, in Example 1, a solution of a nuclei compound is coated on quartz powder which is subsequently fused into quartz glass. The fusion step also decomposes the nuclei compound leaving only the nuclei such as one or more metal ions which are entrapped and incorporated into the molecular structure of the quartz glass. This quartz glass containing nuclei is then drawn into a tube using conventional techniques which can be used directly or slipped over and fused with a pure quartz glass tube resulting in a tube as shown in FIG. 1a. In Example 2, the quartz glass containing nuclei is ground and added to an enamel composition which is coated onto and fused with a pure quartz glass tube again resulting in a tube as shown in FIG. 1a.

During the first 4 to 20 hours of use of a tube according to the invention in a semiconductor doping process, it is believed that a uniformly fine crystalline silica layer forms to a depth approximately equal to the depth of the nuclei. Further exposure to elevated temperatures cause the nuclei to diffuse or migrate further into the tube wall and the crystalline silica layer to continue to grow inherently. However, once the uniformly fine crystalline layer is formed, nuclei diffusion and inherent crystalline growth proceed uniformly and slowly resulting in greatly improved tube life and the ability to use higher temperatures than could be used with prior quartz glass diffusion tubes.

The nuclei used in this invention are present in an amount of from about 4 to about 800 ppm. Uniform distribution of the nuclei is preferred in order to form uniformly fine crystalline silica layers. Concentrations of nuclei ranging between about 10 to 800 ppm. are especially preferred.

The concentrations of nuclei at the outer surface of the quartz-glass element is generally less than about $5 \cdot 10^{17}$ nuclei per sq. cm. and preferably in the range of about $1 \cdot 10^{14}$ to about $5 \cdot 10^{17}$ nuclei per sq. cm. Stated in different terms, the surface concentration of nuclei is in the range of about $5 \cdot 10^{-3}$ to about 25 micrograms per sq. cm.

In the present invention, rather than attempt to prevent or retard divitrification of quartz glass as taught by the prior art, the formation of crystalline silica is promoted in a uniform, very fine manner to yield modified quartz glass elements having totally unexpected longer use at temperatures higher than those that could previously be employed, e.g., 1300° C. and higher.

Also, as illustrated by the graph which comprises FIG. 5, the coefficient of thermal expansion and contraction of crystalline silica such as cristobalite is appreciably greater than quartz glass. Thus, when a crystalline silica layer is formed in a quartz glass element at elevated temperature and cooled down, the interior quartz glass shrinks less than the outer crystalline layer tending to stretch same thereby establishing a tensile stress in and parallel to the outer crystalline layer. The mechanical stability (surface hardness) of an article according to the invention is less at room temperature than the mechanical stability of customary quartz glass also at room temperature. With respect to the known glass ceramic articles having a compressive stress layer, the object is to achieve above all a high mechanical stability at room temperature, whereas their dimensional stability at elevated temperature is reduced. As against that, the object of the invention is to produce articles having a high dimensional stability at room temperature is actually reduced.

Thus, the present invention in its preferred embodiment of a diffusion tube for producing semiconductor elements may have crystallization promoting nuclei uniformly dispersed throughout only the outer portion of the tube to a depth no greater than one-half of the tube wall thickness. In addition, the outer surface of a quartz glass tube, with or without nuclei as described herein, may be provided with a coating of very pure crystalline silica powder such as cristobalite and then heated to form a crystalline silica coating on or a layer within the quartz glass tube. In the instance where crystalline silica powder is coated onto a tube containing nuclei, such nuclei promote the further formation of a layer of crystalline silica in the tube. Because applying a separate coating of crystalline silica involves powder coating techniques and obtaining good adhesion, it is preferred to employ tubes of quartz glass containing only nuclei as described herein and permitting the beneficial crystalline silica to form upon exposure to heat in the diffusion process, for example.

In prior quartz glass elements, impurities (such as those sought to be removed in U.S. Pat. No. 2,904,713) are believed to be the seeds for devitrification which, one initiated proceeds nonuniformly and uncontrolled until the entire element is devitrified. This devitrification known for diffusion tubes of luminous-discharge lamps and which results from the accidental and nonuniform distribution of impurities leads to a nonuniform devitrification of the diffusion tube creating nonuniformly distributed stresses in the tube resulting in the breakage of the tube. In the present invention, the devitrification process is utilized in a unique way resulting in higher use temperatures over longer periods of time than theretofore available. The presence of nuclei or a crystalline silica coating as described herein causes devitrification to occur but with the formation of a uniform, very fine crystalline silica layer which, because of its uniform and fine nature, results in very slow progressive devitrification. This slow down of devitrification has resulted in a 25 to 50 percent increase in the useful life of quartz glass diffusion tubes.

The following examples are intended to illustrate the present invention without limiting the same in any manner.

EXAMPLE 1

Fabricating procedure for a diffusion tube with uniformly dispersed crystallization promoting nuclei throughout the outer portion of the wall of the tube.

Pure quartz crystal granules (e.g. 10 kgs) as they are customarily used for the fusion of pure quartz glass, are wetted by pouring over them a concentrated aqueous solution of aluminum nitrate which contains 8 g of Al-ions, and subsequently dried with continuous stirring. The resulting quartz glass granules have the Al salt adhering to them and have an Al-ion content of 1,200 ppm. These granules are placed into a graphite crucible and heated in a vacuum melting furnace steadily and slowly (for 3 to 4 hours) to a melting temperature (approx. 1,750° C) and, by subsequently maintaining the melting temperature during 30 to 60 minutes, fused into clearly transparent quartz glass. The vacuum melting furnace is an electrically heated (inductively or by current passage) furnace within a vacuum chamber which, prior to and during the melting procedure, is evacuated to a pressure of approx. $10^{-3}$ Torr by mechanical vacuum pumps. The resulting fused quartz glass block contains 200 to 800 ppm of Al, and is subsequently drawn to a tube in an electrically heated quartz glass drawing furnace. The tube drawing furnace essentially consists of a graphite crucible wherein the quartz glass block is lying; at its bottom the crucible has an opening with a nozzle and a mandrel forming the outside and the inside surface of the drawn tube during the drawing process. The electrical heating elements are arranged in the same way as in the melting furnace. However, in the tube drawing, no evacuation takes place. During drawing the drawn Al-containing tube is dimensioned in such a way that it can be comfortably slid over a quartz glass tube without additives and is then fused together with same on a glass blower's lathe to form one tube unit. Basically, this heating process (fusing together of inside and outside tubes) can also take place on a tube drawing bench, at the same time reducing the fused tube portion to a narrower tube. The thickness of the crystallization promoting nuclei containing outer portion of the wall of the tube is obtained from the purely geometric wall thickness ratio between the inner pure quartz glass tube and the outer Al-containing quartz glass tube.

EXAMPLE 2

Another method for producing tubes according to the invention having a predominantly thin outer wall portion with respect to the entire wall is to grind Al-containing quartz glass made according to Example 1 into quartz glass powder (1–20 μ grain size). Thereupon an enamel-like paste or suspension is made from this powder according to the following formula:

1,000 g of the ground quartz glass powder is mixed with 500 g of bi-distilled water to which was previously added 1 g of dextrine adhesive. In order to make this suspension more stable, 1 – 20 g of pure molecular-disperse silicic acid may be added.

This suspension is then applied to the outer surface of a pure quartz glass cylinder (approx. 4–6 g/dm²) and dried. Thereupon this cylinder is drawn into a tube according to the invention on a tube drawing bench as described in Example 1.

EXAMPLE 3

The production of stabilized tubes according to the invention having an outer protective layer is achieved by applying on a stabilized tube a known, more readily fusible glass composition in the form of a powder or in the form of a solution in accordance with known enamelling techniques or in the form of a thin glass film in accordance with known glass processing techniques (e.g. in the form of a thin-walled tube) and fusing into a tube unit in a further heating process.

This process can also be used for tubes prepared according to Example 2 fusing together in the subsequent heating process the protective coating as well as the stabilizing coating with the pure quartz glass tube or hollow cylinder.

What is claimed is:

1. Process for making a fused quartz glass tube capable of forming an outer layer of uniformly fine crystalline silica when heated to a temperature at which such crystalline silica forms which comprises forming a first tube from fused quartz glass containing a crystallization promoting nuclei whose rate of diffusion in quartz glass is less than that of sodium at elevated temperatures, inserting a second, snugly fitting fused quartz glass tube into said first tube and thereafter fusing said first and second tubes together at a temperature of at least 1200° C wherein the fused quartz glass recrystallizes.

2. Process of claim 1 wherein said diffusion process is carried out at a temperature of at least 1300° C.

3. A process according to claim 1 wherein the crystallization promoting nuclei is an element of Group IV of the Periodic Table, boron, aluminum, phosphorus, antimony, zinc, magnesium, calcium, gallium, or an oxide, carbide or nitride thereof.

4. A process according to claim 3 wherein said nuclei are present in an amount of from 4 to about 800 ppm.

5. A process according to claim 4 wherein the concentration of nuclei at the outer surface of the quartz glass tube is less than about $5 \cdot 10^{17}$ nuclei per sq. cm.

6. A process according to claim 5 wherein the surface concentration of said nuclei is from about $1 \cdot 10^{14}$ to about $5 \cdot 10^{17}$ nuclei per sq. cm.

7. Process for making a fused quartz glass tube capable of forming an outer layer of uniformly fine crystalline silica when heated to a temperature at which such crystalline silica forms which comprises grinding into a powder a composition consisting essentially of fused quartz glass containing from about 4 to about 800 ppm of crystallization promoting nuclei having a rate of diffusion in fused quartz glass less than that of sodium at elevated temperatures, applying said powder to the outser surface of a fused quartz glass cylinder and thereafter heating and drawing said cylinder into a tube and heating said tube at a temperature of at least 1200° C.

8. A process according to claim 7 wherein said cyrstallization promoting nuclei is an element of Group IV of the Periodic Table, boron, aluminum, phosphorus, antimony, zinc, magnesium, calcium, gallium, or an oxide, carbide or nitride thereof.

9. A process according to claim 8 wherein the concentration of nuclei at the outer surface of the quartz glass tube is less than about $5 \cdot 10^{17}$ nuclei per sq. cm.

10. A process according to claim 9 wherein the surface concentration of said nuclei is from about $1 \cdot 10^{14}$ to about $5 \cdot 10^{17}$ nuclei per sq. cm.

* * * * *